(12) United States Patent
Chung et al.

(10) Patent No.: US 12,387,957 B2
(45) Date of Patent: Aug. 12, 2025

(54) RIGID CARRIER ASSEMBLIES WITH TACKY MEDIA MOLDED THEREON

(71) Applicant: Daewon Semiconductor Packaging Industrial Company, Santa Clara, CA (US)

(72) Inventors: Sunna Chung, Seoul (KR); Matthew Stanton Whitlock, Santa Clara, CA (US); Athens Okoren, Hanam (KR); Brent Dae Hermsmeier, Santa Clara, CA (US)

(73) Assignee: Daewon Semiconductor Packaging Industrial Company, Santa Clara, CA (US)

( * ) Notice: Subject to any disclaimer, the term of this patent is extended or adjusted under 35 U.S.C. 154(b) by 148 days.

(21) Appl. No.: 17/819,450

(22) Filed: Aug. 12, 2022

(65) Prior Publication Data

US 2022/0384226 A1    Dec. 1, 2022

Related U.S. Application Data

(63) Continuation of application No. PCT/US2021/018068, filed on Feb. 13, 2021.

(Continued)

(51) Int. Cl.
*H01L 21/673* (2006.01)
*B29C 45/00* (2006.01)
(Continued)

(52) U.S. Cl.
CPC .... *H01L 21/67336* (2013.01); *B29C 45/0001* (2013.01); *B29C 45/0055* (2013.01);
(Continued)

(58) Field of Classification Search
CPC .......... H01L 21/67336; B29C 45/0001; B29C 45/0055; B29C 45/14336; B29C 45/1676;
(Continued)

(56) References Cited

U.S. PATENT DOCUMENTS

| 5,396,988 A * | 3/1995 | Skrtic | H05K 13/0084 |
| | | | 206/716 |
| 5,547,082 A * | 8/1996 | Royer | H05K 13/0084 |
| | | | 206/725 |

(Continued)

FOREIGN PATENT DOCUMENTS

| JP | 2007246170 A | 9/2007 |
| WO | 2021163651 A1 | 8/2021 |

OTHER PUBLICATIONS

"International Search Report and Written Opinion" mailed on May 3, 2021 for PCT Application No. PCT/US2021/018068, 12 pages.

*Primary Examiner* — Jeffrey M Wollschlager
(74) *Attorney, Agent, or Firm* — Perkins Coie LLP; Andrew T. Pettit

(57) ABSTRACT

Introduced here are carrier assemblies designed to address the limitations of conventional carrier trays. A carrier assembly can comprise a primary injection-molded component having a deck area for receiving semiconductor components and a secondary injection-molded component that is secured to the deck area of the primary injection-molded component. For example, the secondary injection-molded component may be overmolded on the deck area of the primary injection-molded component. The secondary injection-molded component may have a tacky upper surface that facilitates securement of the semiconductor components to the primary injection-molded component.

15 Claims, 12 Drawing Sheets

Related U.S. Application Data

(60) Provisional application No. 62/976,451, filed on Feb. 14, 2020.

(51) Int. Cl.
    *B29C 45/14* (2006.01)
    *B29K 21/00* (2006.01)
    *B29L 31/34* (2006.01)

(52) U.S. Cl.
    CPC .. *B29C 45/14336* (2013.01); *B29K 2021/003* (2013.01); *B29L 2031/34* (2013.01)

(58) Field of Classification Search
    CPC ... B29C 45/1679; B29C 33/44; B29C 33/442; B29C 45/40; B29C 45/4005; B29C 45/401; B29K 2021/003; B29K 2069/00; B29K 2221/003; B29L 2031/34
    See application file for complete search history.

(56) References Cited

U.S. PATENT DOCUMENTS

| | | | | |
|---|---|---|---|---|
| 5,765,692 | A | * | 6/1998 | Schenz ............... H01L 21/6835 206/460 |
| 5,769,237 | A | * | 6/1998 | Althouse ............ H05K 13/0417 206/460 |
| 6,562,272 | B1 | * | 5/2003 | Chang .................... B29C 45/40 425/444 |
| 7,108,899 | B2 | * | 9/2006 | Extrand ............. H05K 13/0084 414/940 |
| 8,430,264 | B2 | * | 4/2013 | Jewram .............. H05K 13/0084 206/725 |
| 2001/0045676 | A1 | * | 11/2001 | Winterton ........... B29C 37/0032 264/2.5 |
| 2005/0186122 | A1 | * | 8/2005 | Mercer .................... B01L 9/52 422/400 |
| 2013/0142979 | A1 | | 6/2013 | Edwards et al. |
| 2016/0255929 | A1 | * | 9/2016 | Nazzaro ............ B29C 45/14311 |
| 2018/0233455 | A1 | * | 8/2018 | Chew .................. H01L 23/3121 |
| 2019/0067061 | A1 | * | 2/2019 | Chang ............... H01L 21/67336 |

\* cited by examiner

1000

1001
Inject a first liquified material into a mold to create a primary injection-molded component 1002
Create a secondary injection-molded component by molding a second liquified material over the primary injection-molded component 1003
Remove the primary and secondary injection-molded components from the mold

1101
Acquire a primary injection-molded component

1102
Secure a secondary injection-molded component to at least a portion of the primary injection-molded component

1103
Cause static electricity to be discharged from the carrier assembly formed from the primary and secondary injection-molded components

1104
Allow a semiconductor component to be secured to the secondary injection-molded component

1201
Obtain a semiconductor component

1202
Adhere the semiconductor component to a tacky injection-molded component of a carrier assembly 1203
Transport the carrier assembly to a desired location 1204
Remove the semiconductor component from the tacky injection-molded component of the carrier assembly

FIGURE 12

RIGID CARRIER ASSEMBLIES WITH TACKY MEDIA MOLDED THEREON

CROSS REFERENCE TO RELATED APPLICATIONS

This application is a continuation of International Application No. PCT/US2021/018068, titled "Rigid Carrier Assemblies with Tacky Media Molded Thereon" and filed on Feb. 13, 2021, which claims the benefit of U.S. Provisional Application No. 62/976,451, titled "Rigid Carrier Assemblies with Tacky Media Molded Thereon" and filed on Feb. 14, 2020, which are incorporated herein by reference in their entireties.

RELATED FIELD

Various embodiments concern carrier assemblies having injection-molded media for securing semiconductor components in place along the surface of a rigid tray, as well as methods for manufacturing and using the same.

BACKGROUND

In electronics, a wafer (also referred to as a "slice" or "substrate") is a thin slice of semiconductor that can be used in the fabrication of integrated circuits (ICs). The wafer serves as the substrate upon which microelectronic components are installed to build a microelectronic device. Generally, a wafer will undergo a series of microfabrication processes such as doping, ion implantation, etching, thin-film deposition of various materials, and photolithographic patterning. In some instances, the individual microcircuits are separated from one another as part of a dicing procedure and then packaged as an integrated circuit. Collectively, the wafers, dies, and microelectronic components may be referred to as "semiconductor components."

Several different configurations have been used to facilitate the transportation of semiconductor components between different sites, namely, stick magazines, injection-molded trays, and carrier tapes. For example, carriers may transport semiconductor components from one location to another location to facilitate the manufacture of ICs from the semiconductor components. This is especially true for carriers who are members of the Joint Electron Device Engineering Council (JEDEC), which has established standards for safe handling, transport, and storage of ICs, modules, and semiconductor components.

Stick magazines (also referred to as "shipping tubes") can be used to transport semiconductor components from the manufacturing site to the assembly site. Moreover, stick magazines may be designed such that the semiconductor components retained therein can be fed to automatic-placement machines for surface mounting and through-hole mounting.

Injection-molded trays (also referred to as "shipping trays") may be used to contain semiconductor components while assembly operations, delivery operations, and/or mounting operations are being performed. For example, an injection-molded tray could be used to transport semiconductor components from the manufacturing site to the assembly site. As another example, an injection-molded tray could be used to present/feed semiconductor components to automatic-placement machines for surface mounting on board assemblies. Injection-molded trays are typically designed for semiconductor components that have leads on four sides (e.g., Quad Flat Package (QFP) and thin QFP (TQFP) packages) and require lead isolation during shipping, handling, or processing.

Carrier tapes may be used to transport semiconductor components from the manufacturing site to the assembly site, as well as to store the semiconductor components at these sites. Normally, carrier tapes are wound around a reel so that the semiconductor components stored therein can be readily presented/fed to automatic-placement machines for surface mounting on board assemblies.

However, these configurations exhibit limitations that affect the production of ICs. For example, the optimum quantity of semiconductor components per square area is limited due to the restrictions on retention of individual semiconductor components. As another example, the lateral movement of the semiconductor components is limited due to the design/arrangement of the punched cavities in which semiconductor components are placed. Semiconductor components have historically been placed into punched cavitied to avoid inadvertent damage. Such limitations lead to low manufacturing/handling capacity and high testing costs.

BRIEF DESCRIPTION OF THE DRAWINGS

Various features of the technology will become more apparent to those skilled in the art from a study of the Detailed Description in conjunction with the drawings. Embodiments of the technology are illustrated by way of example and not limitation in the drawings, in which like references may indicate similar elements.

FIG. 10 is a flowchart of a process for creating a carrier assembly comprised of a primary injection-molded component and a secondary injection-molded component via overmolding.

FIG. 11 is a flowchart of another process for creating a carrier assembly comprised of a primary injection-molded component and a secondary injection-molded component.

FIG. 12 is a flowchart of a process for transporting semiconductor components using the carrier assemblies described herein.

Figure 1:
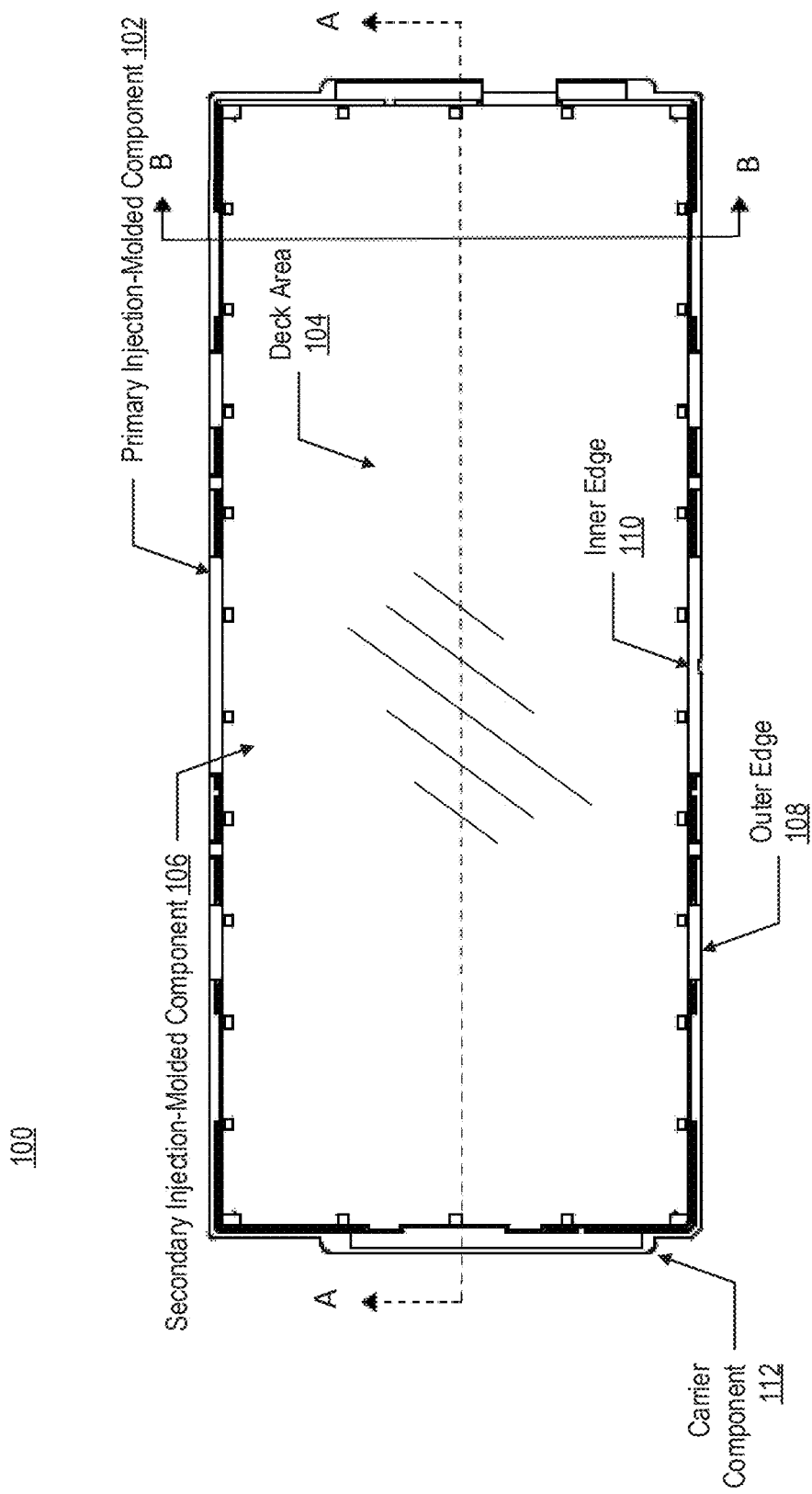
FIG. 1 depicts an example of a carrier assembly that includes a primary injection-molded component (also referred to as the "substrate") with a continuous deck area that is overmolded with a secondary injection-molded component (also referred to as the "overmold").

The drawings depict various embodiments for the purpose of illustration only. Those skilled in the art will recognize that alternative embodiments may be employed without departing from the principles of the technology. Accordingly, while specific embodiments are shown in the drawings, the technology is amenable to various modifications.

DETAILED DESCRIPTION

One option for handling, transporting, and storing semiconductor components is a carrier tray. A carrier tray may be designed specifically to protect, for example, semiconductor wafers that are thin and circular. Such embodiments of the carrier tray may include circular cavities (also referred to as "pockets") that are sized to receive the semiconductor wafers. Carrier trays have conventionally restricted the movement of the semiconductor components stored therein by maintaining physical contact with each semiconductor components.

Carrier trays may be utilized to transport semiconductor components between multiple facilities during the manufacturing, testing, and assembling processes. Moreover, carrier trays may be utilized to store semiconductor components within a storage facility before, during, or after such processes. Carrier trays can be designed to prevent semiconductor components from coming into contact with one another, thereby avoiding damage to the semiconductor components. Some carrier trays are able to present the semiconductor components held therein to a manual placement tool or an automatic placement tool (also referred to as a "pick-and-place machine") for testing, dicing, etc. Dicing may result in a semiconductor component (e.g., a wafer) being diced into a series of subcomponents, and these subcomponents can be utilized in the fabrication of an integrated circuit (IC).

Carrier trays are popular in the semiconductor industry due to their ability to reliably protect semiconductor components from damage during transport. However, conventional carrier trays exhibit several limitations that restrict their ability to provide adequate protection to sensitive semiconductor components. For example, carrier trays have historically been produced via an injection molding process. However, an injection-molded carrier tray may inadvertently damage a semiconductor component due to an external force applied to part(s) of the injection-molded carrier tray in contact with the semiconductor component. The injection-molded carrier tray may also fail to properly dissipate static electricity, which can lead to further damage to the semiconductor components disposed thereon due to electrostatic discharge (ESD). Such limitations can lead to damaged semiconductor components, greater transport costs, and lower efficiency in the manufacturing, testing, and assembling of semiconductor components.

Introduced here, therefore, are carrier assemblies (or simply "assemblies") designed to address the limitations of conventional carrier trays. A carrier assembly can comprise a primary injection-molded component having a deck area with a substantially planar surface for receiving semiconductor components and a secondary injection-molded component that is secured to the deck area of the primary injection-molded component. The secondary injection-molded component may have a tacky upper surface that facilitates securement of the semiconductor components to the primary injection-molded component. Due to its tacky nature, the secondary injection-molded component allows semiconductor components to be detachably secured to the carrier assembly with minimal risk of harm/damage. Examples of semiconductor components include wafers (e.g., singulated wafers and diced wafers), dies (e.g., bumped dies and bare dies), and other microelectronic components used in the fabrication of ICs. Embodiments have been described in the context of wafers for the purpose of illustration only. Those skilled in the art will recognize the carrier assemblies described herein could be designed to handle, transport, or store any type of semiconductor component.

Carrier assemblies can be provided with a secondary injection-molded component that is integrated along the deck area of a primary injection-molded component through overmolding. Overmolding is a two-shot injection molding process that creates a single part (e.g., a carrier assembly) by combining two separate but complementary thermoplastic materials. For example, the first shot may create the primary injection-molded component using a first thermoplastic material while the second shot may create the secondary injection-molded component using a second thermoplastic material. The first shot (referred to as the "substrate") is usually comprised of a rigid plastic and designed to accept the second shot (referred to as the "overmold"). The overmold is typically comprised of a softer material than the rigid plastic. For example, the overmold may be comprised of a flexible plastic-like rubber.

As further discussed below, the secondary injection-molded component may be bonded along the deck area of the primary injection-molded component as a single piece or a series of multiple pieces. Semiconductor components can then be secured to the carrier assembly based on the tackiness of the upper surface of the secondary injection-molded component. Thus, proper securement of the semiconductor components to the carrier assembly may depend on the tackiness of the constituent material(s) of the secondary injection-molded component.

In some embodiments semiconductor components are detached from the secondary injection-molded component manually (e.g., by a human hand), while in other embodiments semiconductor components are detached from the secondary injection-molded component automatically (e.g., by a computer-implemented system, such as a pick-and-place robotic system). Thus, the semiconductor components may be readily separated following transport to a manufacturing facility or a testing facility, though the semiconductor components may remain stable when the carrier assembly is rotated along the x-axis, y-axis, or z-axis.

One object of the present invention is to provide a simple, reliable option for quickly securing semiconductor components to a carrier assembly. A semiconductor component may use the deck area of the primary injection-molded component as the positioning/seating plane upon which semiconductor components can be secured. For example, the primary injection-molded component may include one or more cavities along its upper surface in which semiconductor components can be secured, and the secondary injection-molded component may conform to these cavities. Such an approach enables the carrier assembly to be rotated and moved laterally/longitudinally without displacing or damaging the semiconductor components.

Terminology

References in this description to "an embodiment" or "one embodiment" means that the feature, function, structure, or characteristic being described is included in at least one embodiment. Occurrences of such phrases do not necessarily refer to the same embodiment, nor are they necessarily referring to alternative embodiments that are mutually exclusive of one another.

Unless the context clearly requires otherwise, the words "comprise" and "comprising" are to be construed in an inclusive sense rather than an exclusive or exhaustive sense (i.e., in the sense of "including but not limited to"). The terms "connected," "coupled," or any variant thereof is intended to include any connection or coupling, either direct or indirect, between two or more elements. The coupling/connection can be physical, logical, or a combination thereof. For example, components may be electrically or communicatively coupled to one another despite not sharing a physical connection.

The term "based on" is also to be construed in an inclusive sense rather than an exclusive or exhaustive sense. Thus, unless otherwise noted, the term "based on" is intended to mean "based at least in part on."

When used in reference to a list of multiple items, the word "or" is intended to cover all of the following interpretations: any of the items in the list, all of the items in the list, and any combination of items in the list.

The sequences of steps performed in any of the processes described here are exemplary. However, unless contrary to physical possibility, the steps may be performed in various sequences and combinations. For example, steps could be added to, or removed from, the processes described here. Similarly, steps could be replaced or reordered. Thus, descriptions of any processes are intended to be open-ended.

Technology Overview

FIG. 1 depicts an example of a carrier assembly 100 that includes a primary injection-molded component 102 (also referred to as the "substrate") with a continuous deck area 104 that is overmolded with a secondary injection-molded component 106 (also referred to as the "overmold"). The carrier assembly 100 can be designed to handle semiconductor components of different sizes (e.g., different heights, widths, and lengths). Moreover, the carrier assembly 100 can be designed to accommodate different fabrication facilities, processes, etc. The carrier assembly 100 may be designed to maximize the density of semiconductor components to improve the efficiency of transporting, shipping, or storing those semiconductor components.

In some embodiments, the carrier assembly 100 is designed to be compliant with Joint Electron Device Engineering Council (JEDEC), which sets standards for electrostatic discharge, handling, packing, and shipping of surface-mount devices. To comply with various JEDEC-imposed standards, the carrier assembly 100 may be comprised of certain materials, manufactured in certain shapes/sizes, etc.

The shape and/or size of the carrier assembly 100 may be adapted to suit particular manufacturing, transporting, or storing needs. For example, the primary injection-molded component 102 may have a rectangular structural body as shown in FIG. 1. Alternatively, the primary injection-molded component 102 may have a non-rectangular structural body in the firm of, for example, a square, parallelogram, ellipse, etc. The size and/or shape of the primary injection-molded component 102 may be based on, for example, the design of a container in which the carrier assembly 100 is to be placed. For example, rectangular structural bodies may be desirable if the carrier assemblies are to be loaded into containers having rectangular footprints. As another example, non-rectangular structural bodies may be desirable if the carrier assemblies are to be loaded into containers having non-rectangular footprints.

In some embodiments, the structural body of the primary injection-molded component 102 includes an outer edge 108 that defines the periphery of the carrier assembly 100 and an inner edge 110 that defines the periphery of the deck area 104. The outer edge 108 may extend along the entire outer periphery of the primary injection-molded component 102 in an uninterrupted manner. The inner edge 110, meanwhile, may be substantially parallel to the outer edge 108. Together, the outer and inner edges 108, 110 may define opposing edges of a rim that extends around at least a portion of the deck area 104. Here, the rim extends around the entire periphery of the deck area 104 of the primary injection-molded component 102. Note, however, that the rim may include features that cause its height to vary. For example, the rim may include one or more interlock components to facilitate the connection with an upwardly adjacent carrier assembly as further discussed below. When a semiconductor component is set on the secondary injection-molded component 106 within the deck area 104 of the primary injection-molded component 102, the surface of the deck area 104 may be substantially parallel to the bottom surface of the semiconductor component and substantially perpendicular to the outer edge of the semiconductor component. In some embodiments the sidewall of the rim that is defined by the inner edge 110 is substantially orthogonal to the surface of deck area 104, while in other embodiments the sidewall of the rim that is defined by the inner edge 110 has a pitch (i.e., is angled with respect to the surface of the deck area 104).

The primary injection-molded component 102 can be comprised of a rigid material, such as molded plastic or molded resin. Examples of such materials include polycarbonates, polyphenylene ether (PPE), polyphenylene oxide (PPO), polyphenylene sulfide (PPS), thermoplastics such as polyethylene or polypropylene, liquid crystal polymer, ethylene chlorotrifluoroethylene (ECTFE), or any other material suitable for creating injection-molded objects. In some embodiments, the primary injection-molded component 102 is at least partially comprised of a conductive material, such as silver, copper, aluminum, or a ceramic. In some embodiments the primary injection-molded component 102 is comprised of a single material, while in other embodiments the primary injection-molded component 102 is comprised of multiple materials. For example, the primary injection-molded component 102 may be comprised of multiple materials that are mixed together before being injection into a mold to take its final form. As another example, the primary injection-molded component 102 may be created using a first material (also referred to as a "rigid material") able to avoid physical damage and a second material (also referred to as an "anti-static material" or a "static-dissipative material") able to facilitate the dissipation of collected electricity. The second material may be sprayed onto the first material, adhered to the first material, or otherwise incorporated into the first material (e.g., as molten materials during a mixing stage of the manufacturing process).

As further discussed below, the primary injection-molded component 102 may be comprised of a material known to be suitable for injection molding with the goal of producing a carrier assembly 100 that is resistant to moisture and/or electricity (e.g., to prevent static electricity collection and electrostatic discharge). For example, the structural body of the primary injection-molded component 102 may include an anti-static material or a static-dissipative material. As another example, the structural body may be comprised of a resilient material capable of protecting semiconductor components from physical damage.

In some embodiments the secondary injection-molded component 106 is overmolded along a portion of the deck area 104, while in other embodiments the secondary injection-molded component 106 is overmolded along the entirety of the deck area 104 (e.g., as a single continuous sheet). The secondary injection-molded component 106 may be tacky along both sides due to its constituent material(s). That is, the secondary injection-molded component 106 may have a first tacky surface in contact with the deck area 104 and a second tacky surface in contact with the bottom surface(s) of the semiconductor component(s) affixed within the deck area 104. In some embodiments, an adhesive film is secured along the first tacky surface of the secondary injection-molded component 106 to promote adhesion to the primary injection-molded component 102. The adhesive film can be comprised of any suitable adhesive material having sufficient adhesiveness. For example, the adhesive film may be comprised of a polymer-based adhesive. An adhesive film may be placed between the primary and secondary injection-molded components 102, 106 if, for example, the fit of these components is imprecise, the components are created in separate injection molding processes, etc.

In some embodiments, the secondary injection-molded component 106 is only tacky along a single side (e.g., the outward-facing side to which semiconductor components are secured). In such embodiments, the primary injection-molded component 102 may include one or more fastening mechanisms to hold the secondary injection-molded component 106 against the top surface of the deck area 104. Examples of fastening mechanisms include clasps, clips, and tabs. Additionally or alternatively, the primary injection-molded component 102 may include one or more anchor points to which the secondary injection-molded component 106 can be secured. For example, the primary injection-molded component 102 may include one or more holes within the deck area 104 that are capable of receiving protrusions along the bottom surface of the secondary injection-molded component 106. Those skilled in the art will recognize that a variety of structural features could be used to maintain the arrangement of the primary and secondary injection-molded components 102, 106. Examples of such structural features include indentations (also referred to as "notches"), flanges, kinematic nests, slots, shoulders, etc.

In some embodiments, the primary injection-molded component 102 includes a pre-molded area to receive the secondary injection-molded component 106. For example, the deck area 104 may include a 10-inch by 10-inch depression in which the secondary injection-molded component 106 can be placed. In some embodiments at least one side of the depression is aligned with the inner edge 110 of the rim, while in other embodiments the depression is offset from the inner edge 110 of the rim. As another example, the deck area 104 may include a series of cavities, each of which is designed to hold a separate semiconductor component. In some embodiments each cavity includes a separate secondary injection-molded component, while in other embodiments a single secondary injection-molded component overlays all of the cavities.

The secondary injection-molded component 106 may be sized in such a manner to restrict subsequent movement. For example, the secondary injection-molded component 106 may be injected/secured such that it contacts at least a portion of the sidewall defined by the inner edge 110. Alternatively, the secondary injection-molded component 106 may be injected/secured such that it does not contact the sidewall defined by the inner edge 110. Thus, the secondary injection-molded component 106 may only be in contact with the deck area 102 of the primary injection-molded component 102.

The secondary injection-molded component 106 can be comprised of any suitable material having sufficient tackiness for securing semiconductor components placed thereon. For example, the secondary injection-molded component 106 may be comprised of a thermoplastic elastomer (also referred to as a "thermoplastic rubber"). Examples of thermoplastic elastomers include styrenic block copolymers (TPS), thermoplastic polyolefinelastomers (TPO), thermoplastic vulcanizates (TPV), thermoplastic polyurethanes (TPU), thermoplastic copolyesters (TPC), and thermoplastic polyamides (TPA). The secondary injection-molded component 106 can be ejected onto, or installed on, the primary injection-molded component 102 such that the entirety of the deck area 104—including any structural features such as JEDEC-compliant punched cavities—is covered. Thus, the entire deck area 104 may be overmolded with the secondary injection-molded component 106. In some embodiments, the secondary injection-molded component 106 may itself include cavities designed to receive semiconductor components. For example, the secondary injection-molded component 106 may include one or more circular cavities that are sized to receive circular semiconductor components, one or more rectangular cavities that are sized to receive rectangular semiconductor components, or any combination thereof.

The secondary injection-molded component 106 may be a rubber-like thermoplastic elastomer that is affixed to at least a portion of the top surface of the primary injection-molded component 102 as a single continuous sheet without any breaks. This can be done in several different ways, including via an overmolding process, a lamination process, a spray process, or a co-extrusion process. In some embodiments, a top cover (not shown) is affixed to the top surface of the secondary injection-molded component 106. The top cover may be removed from the top surface of the secondary injection-molded component 106 before any semiconductor components are affixed to the secondary injection-molded component 106 (and thus to the carrier assembly 100). Those skilled in the art will recognize that the top cover may not always be present. For example, the top cover may be unnecessary if semiconductor components are to be secured to the secondary injection-molded component 106 soon after the secondary injection-molded component 106 is overmolded to the top surface of the primary injection-molded component 102.

The carrier assembly 100 may also include one or more carrier components 112. These carrier components 112 may be parts of the primary injection-molded component 102 and/or the secondary injection-molded component 106. These carrier components 112 may extend outward from the outer edge 108 of the carrier assembly 100 or upward from the upper edge of the rim defined by the outer and inner edges 108, 110 of the carrier assembly 100. Moreover, these carrier components 112 may be designed to allow for easier transportation. For example, a pair of carrier components 112 may be arranged along opposing sides of the carrier assembly 100 to allow it (as well as any other carrier assemblies to which it is connected) to be transported with greater ease and efficiency. Each carrier component 112 may be formed into a shape that can be readily held (e.g., by an individual or a machine). Examples of such shapes include rectangular tabs/handles, semicircular tabs/handles, etc. At least some of the carrier components 112 could include a handle, a latch, a tab, or another known mechanism for assisting in the transportation of the carrier assembly 100. In some embodiments each carrier component 112 separately engages the carrier assembly 100 (e.g., with screws that extend into threaded holes in the primary or secondary injection molded components 102, 106), while in other embodiments the carrier assembly 100 and carrier components 112 form a single monolithic component.

Figure 2:
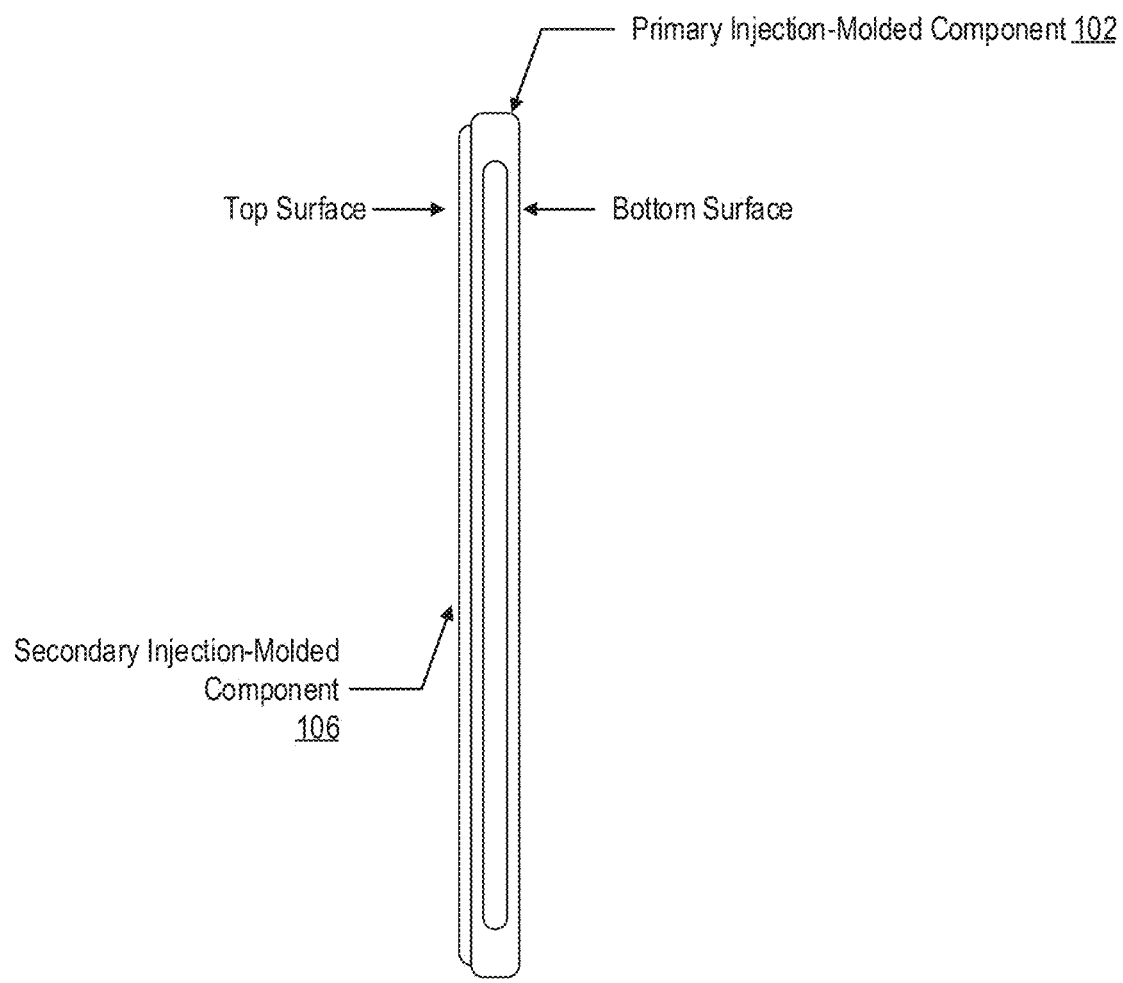
FIG. 2 illustrates a vertical section view of the carrier assembly taken along line B of FIG. 1.

FIG. 2 illustrates a vertical section view of the carrier assembly 100 taken along line B of FIG. 1. As noted above, the secondary injection-molded component 106 can be integrally mounted along the top surface of the primary injection-molded component 102. The secondary injection-molded component 106 may be secured to the primary injection-molded component 102 such that it is substantially flush with the deck area 104 of the carrier assembly 100. For example, the primary injection-molded component 102 may be overlaid with a thermoplastic elastomer that represents the secondary injection-molded component 106 during an overmolding process.

Figure 3:
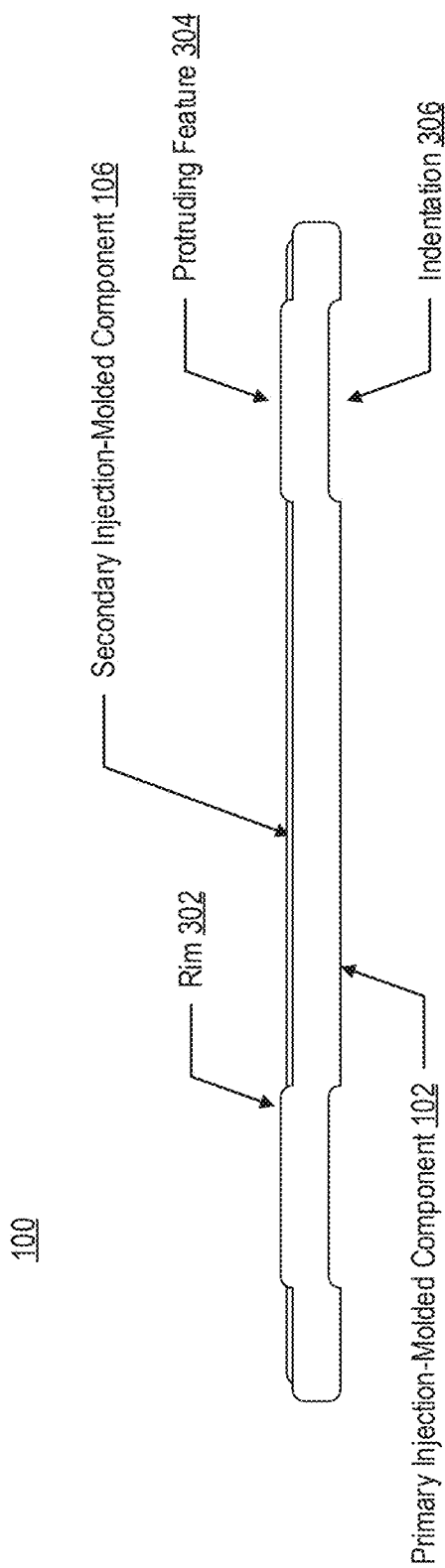
FIG. 3 illustrates a horizontal sectional view of the carrier assembly taken along line A of FIG. 1.

FIG. 3 illustrates a horizontal sectional view of the carrier assembly 100 taken along line A of FIG. 1. As noted above, the carrier assembly 100 may include a rim 302 that extends around at least a portion of the periphery of the deck area in which semiconductor components can be secured. In some embodiments, the rim 302 includes one or more interlock components to facilitate a stable connection with an adjacent carrier assembly. As shown in FIG. 3, the interlock component(s) can include protruding features 304 and/or indentations 306 designed to complement protruding features. These interlock component(s) can be arranged along the upper surface of the rim 302, the bottom surface of the carrier assembly 100, or any combination thereof. Thus, the interlock component(s) may be useful in ensuring stable connections are made with upwardly adjacent carrier assemblies and/or downwardly adjacent carrier assemblies.

The interlock component(s) may also make the carrier assembly 100 more suitable to be used in future processes. For example, when the carrier assembly 100 is used for storage or transport, it may be beneficial to stack a series of carrier assemblies on top of one another. Having a locking mechanism would ensure that these carrier assemblies do not move in such a manner that would damage the semiconductor components secured therein. While the interlock component(s) represent passive locking mechanisms, those skilled in the art will recognize that more active locking mechanisms could also be used. For example, each carrier assembly may include a latch that can be used to actively secure it to another carrier assembly. As another example, when a mechanical device is needed to remove the semiconductor components from the carrier assembly 100, the interlock component(s) may serve as a support structure capable of mechanically interfacing with the mechanical device. For instance, a robotic arm may use an indentation for balance, a protruding feature for positional reference, etc.

In some embodiments, the top surface of the rim 302 is substantially co-planar with the top surface of any semiconductor components secured within the carrier assembly 100. Thus, the height of the rim 302 may be based on the thickness of the semiconductor components to be secured within the carrier assembly 100. In other embodiments, the top surface of the rim 302 is higher than the top surface of any semiconductor components secured within the carrier assembly 100. Such a design causes a space to be formed between the top surface of each semiconductor component and the bottom surface of an upwardly adjacent carrier assembly, which may limit the likelihood of damage to the semiconductor components due to an external force applied by the upwardly adjacent carrier assembly.

Figure 4:
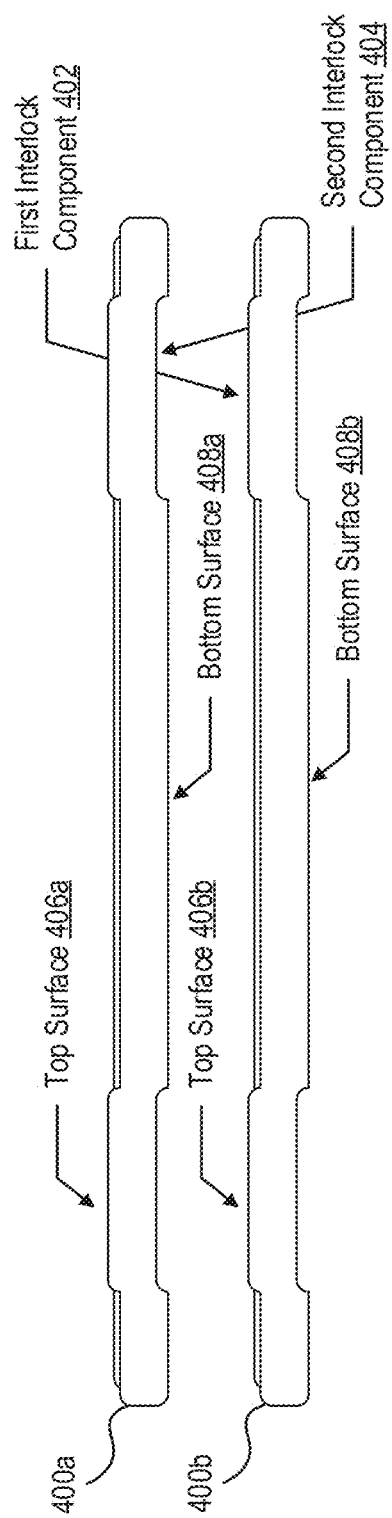
FIG. 4 includes an exploded view of multiple carrier assemblies stacked in preparation for handling, transporting, and/or storing semiconductor components.

FIG. 4 includes an exploded view of multiple carrier assemblies 400*a-b* stacked in preparation for handling, transporting, and/or storing semiconductor components. A first interlock component 402 disposed along the top surface of one carrier assembly 400*b* may interface with a second interlock component 404 disposed along the bottom surface of another carrier assembly 400*a* when the carrier assemblies 400*a-b* are brought within close proximity of one another.

Each carrier assembly 400*a-b* has a top surface 406*a-b* and a bottom surface 408*a-b*. The top surface 406*a-b* may be defined by the planar surface of the uppermost point of the carrier assembly 400*a-b*. For example, the top surface 406*a-b* may correspond to the planar surface of the rim (i.e., while ignoring any indentations). The bottom surface 408*a-b* may be defined by the planar surface of the lowermost point of the carrier assembly 400*a-b*. In some embodiments the lowermost point of the carrier assembly 400*a-b* is the bottom surface of the primary injection-molded component, while in other embodiments the lowermost point of the carrier assembly 400*a-b* is the planar surface of an interlock component (e.g., a protruding feature) that extends away from the bottom surface of the primary injection-molded component.

As shown in FIG. 4, the bottom surface of each carrier assembly 400*a-b* may include interlock component(s) designed to engage complementary interlock component(s) of a downwardly adjacent carrier assembly. Similarly, the top surface of each carrier assembly may include interlock component(s) designed to engage complementary interlock component(s) of an upwardly adjacent carrier assembly. Together, these interlock components enable adjacent carrier assemblies to be mechanically coupled to each other in a detachable manner without increasing the risk of harming the semiconductor components stored therein.

The interlock components 402, 404 may represent two different types of interlock component. The first type of interlock component extends away from a reference surface. Examples of the first type of interlock component include protrusions, projections, pins, etc. The second type of interlock component is designed to receive an interlock component of the first type. Examples of the second type of interlock component include notches, slots, recesses, etc.

Generally, the first interlock component 402 and the second interlock component 404 are different types of interlock components. Here, for example, the first interlock component 402 is an interlock component of the first type (e.g., a protrusion), while the second interlock component is an interlock component of the second type (e.g., a notch). Accordingly, the first interlock component 402 can engage a corresponding interlock component of the second type on an upwardly adjacent carrier assembly, while the second interlock component 404 can engage a corresponding interlock component of the first type on a downwardly adjacent carrier assembly.

While the interlock components shown in FIG. 4 extend around the entirety of the top surfaces 406*a-b* and bottom surfaces 408*a-b* of the carrier assemblies 400*a-b*, those skilled in the art will recognize that other designs are possible. For example, each carrier assembly 400a-b may include a specified number of interlock components (e.g., one, two, four, or eight) arranged along the top surface 406a-b and/or the bottom surface 408a-b. These interlock component(s) can be positioned in different arrangements. For example, each carrier assembly 400a-b could include a pair of interlock components of the first type on opposing edges along the top surface 406a-b and a pair of interlock components of the second type on opposing edges along the bottom surface 408a-b. As another example, each carrier assembly 400a-b could include four interlock components equally distributed along the top surface 406a-b and four interlock components equally distributed along the bottom surface 408a-b. To allow for easier stacking, the number of interlock component(s) along the top surface 406a-b and the bottom surface 408a-b are usually the same. However, that need not necessarily be the case. For example, the carrier assemblies 400a-b may include two interlock components along the top surface 406a-b and four interlock components along the bottom surface 408a-b. Such a design may permit the interlock components along the top surface 406a-b to be engaged with the interlock components along the bottom surface 408a-b in several different ways (e.g., to allow for variation in arranging the carrier assemblies 400a-b).

Figure 5:
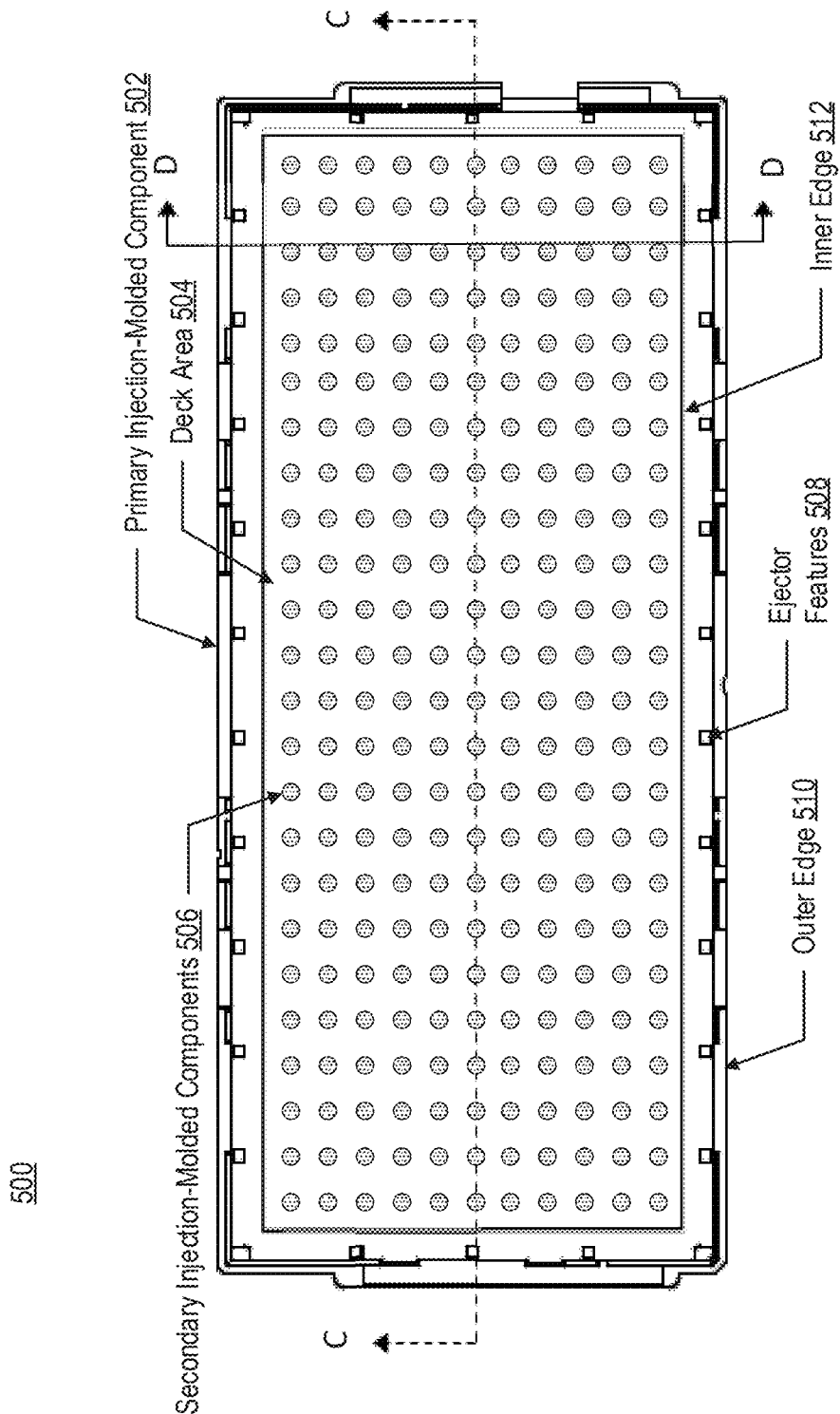
FIG. 5 includes a top plane view of a carrier assembly that includes a primary injection-molded component with a deck area on which a secondary injection-molded component has been mounted.

FIG. 5 includes a top plane view of a carrier assembly 500 that includes a primary injection-molded component 502 with a deck area 504 on which a secondary injection-molded component 506 has been mounted. In some embodiments, the primary injection-molded component 502 includes structural ejector features 508 (or simply "ejector features") that can be used to facilitate removal from the mold so as to prevent marking from the ejector pins (also called "push pins"). Rather than apply pressure to the deck area 504, the ejector pins can instead apply pressure to these ejector features 508. As shown in FIG. 5, these ejector features 508 may be arranged around the periphery of the deck area 504 so as to not interfere with any semiconductor components mounted therein. Additionally or alternatively, ejector features may be located elsewhere on the primary injection-molded component 502.

In some embodiments, the secondary injection-molded component 506 is affixed to the deck area 504 using one or more securement mechanisms (not shown) configured to apply downward pressure to the secondary injection-molded component 506. For example, a series of securement mechanisms designed to pinch the secondary injection-molded component 506 in the form of a continuous sheet may be arranged along a periphery of the deck area 504. Examples of securement mechanisms include components that operate similar to paperclips, clamps, clasps, or binder clips. In many embodiments, the securement mechanisms are not necessary. Here, for example, the carrier assembly 500 includes a series of cavities in which secondary injection-molded components 506 have been integrated. Because the secondary injection-molded components 506 are limited to the cavities in the deck area 504, no securement mechanisms are necessary. Note that semiconductor components need not necessarily be secured to the series of secondary injection-molded components 506 in a one-to-one manner. For example, a semiconductor component may be secured to a single secondary injection-molded component 506 (and thus overlays a single cavity in the primary injection-molded component 502), or a semiconductor component may be secured to multiple secondary injection-molded components 506 (and thus overlays multiple cavities in the primary injection-molded component 502).

In some embodiments, the secondary injection-molded component 506 is integrally secured along a central mounting portion of the carrier assembly 500 during an overmolding process such that the secondary injection-molded component 506 (also referred to as the "overmolding") conforms to the deck area 504 whose outer perimeter is defined by the inner edge 512. As discussed above, the secondary injection-molded component 506 may extend across the entire deck area 504 as a single continuous sheet. Alternatively, a series of secondary injection-molded components (also referred to as "patches of secondary injection-molded media") may be secured within the deck area 502. When a semiconductor component is secured within the deck area 504, a protruding feature disposed along the outer surface of the semiconductor component may pierce the secondary injection-molded component 506. In such embodiments, the primary injection-molded component 502 and/or secondary injection-molded component 506 may include a complementary feature (e.g., a notch) designed to receive the protruding feature of the semiconductor component.

The surface adhesion (also referred to as "tackiness") of the secondary injection-molded component 506 holds the semiconductor components in place as the carrier assembly 500 is moved. For example, the secondary injection-molded component 506 can hold one or more semiconductor components in a specified orientation while handling, transporting, or storing the semiconductor component(s). Moreover, the secondary injection-molded component 506 may be designed such that the semiconductor component(s) can be readily separated/detached from the carrier assembly 500, either manually or automatically. The secondary injection-molded component 506 can ensure that the semiconductor component(s) do not substantially move when the carrier assembly 500 is rotated along the x-axis, y-axis, or z-axis, or moved vertically/horizontally with respect to, for example, an automatic-placement machine.

As further discussed below, the secondary injection-molded component 506 can be overmolded to the deck area 504 in a single continuous flow along the entire length of the carrier assembly 500. For example, a liquified thermoplastic elastomer may be spread in the deck area 504 such that the secondary injection-molded component 506 is formed across the entire length of the carrier assembly 500 including any cavities, such as pre-formed, JEDEC-compliant cavities. In some embodiments, the secondary injection-molded component 506 comprises multiple overmolded materials. For example, multiple overmolding processes may be performed in succession to create a secondary injection-molded component 506 that is comprised of a series of injection-molded sheets layered within the deck area 504. Thus, the secondary injection-molded component 506 may one or more layers of thermoplastic elastomer overmolded on the deck area 504 of the primary injection-molded component 502.

Generally, the secondary injection-molded component 506 does not cover the side portions along the outer edge 510 of the carrier assembly 500. Said another way, the secondary injection-molded component 506 will typically not extend up the sidewall of the rim defined by the outer and inner edges 510, 512. However, in some embodiments, the secondary injection-molded component 506 does at least partially cover the sidewalls of the rim extending around the deck area 504. Together, the primary and secondary injection-molded components 502, 506 form the carrier assembly 500 that can be used to universally transport items (e.g., singulated silicon components or silicon die of the same or different sizes) as necessary for manufacturing, shipping, and/or storing. The addition of the secondary injection-molded component 506 may enable the carrier assembly 500 to transport items of different sizes, unlike conventional carrier trays that are designed for semiconductor components of a particular size.

As shown in FIG. 5, the deck area 504 of the primary injection-molded component 502 may include a series of secondary injection-molded components 506 in some embodiments. Here, for example, secondary injection-molded components 506 are secured to structural mounting features (or simply "mounting features") having a circular shape. Those skilled in the art will recognize that other shapes may be more appropriate in certain situations. For example, the deck area 504 could instead include rectangular mounting features. Moreover, the deck area 504 could include mounting features of multiple shapes if, for example, the carrier assembly 500 is designed for multiple types of semiconductor components. The pattern of mounting features across the deck area 504 may be regular or random. Here, for example, the mounting features are laid out in a columnar format. In other embodiments, the mounting features may be laid out in an offset columnar format (e.g., where the mounting features in one row or column are offset from the mounting features in the adjacent rows or columns). Alternatively, the mounting features may be randomly arranged about the deck area 504.

Mounting features may extend upward from the planar surface of the deck area 504 so as to form extrusions upon which secondary injection-molded components 506 can be secured. Additionally or alternatively, mounting features may extend downward from the planar surface of the deck area 504 so as to form cavities in which secondary injection-molded components 506 can be secured. A single carrier assembly may include "upward" mounting features, "downward" mounting features, or any combination thereof. The height of these mounting features may be random, regular, or a combination thereof. For example, all of the mounting features to which secondary injection-molded components 506 are to be secured may have a consistent height. As another example, the mounting features to which secondary injection-molded components 506 are to be secured may have random or semi-random heights. There may be a systematic pattern in how the heights are selected in some embodiments. For example, all of the mounting features in the same row or column may have the same height, though the mounting features in adjacent rows or columns may have different heights. For instance, the heights of the mounting features may increase progressively from one side of the deck area 504 to the other. Alternatively, the heights of the mounting features may be selected at random. Note that the term "height," as used in this context, is also intended to cover depth. As such, the use of the term "height" does not refer solely to "upward" mounting features but also covers "downward" mounting features.

In FIG. 5, the material(s) from which the secondary injection-molded components 506 are comprised are deposited only onto the mounting features. However, those skilled in the art will recognize that the material could instead be deposited over the mounting features and intervening spaces. In such a scenario, a single secondary injection-molded component could be described as being "draped over" the deck area of the primary injection-molded component 502, including any mounting features.

As noted above, a carrier assembly comprised of primary and secondary injection-molded components can be created in several different ways.

Figure 6A:
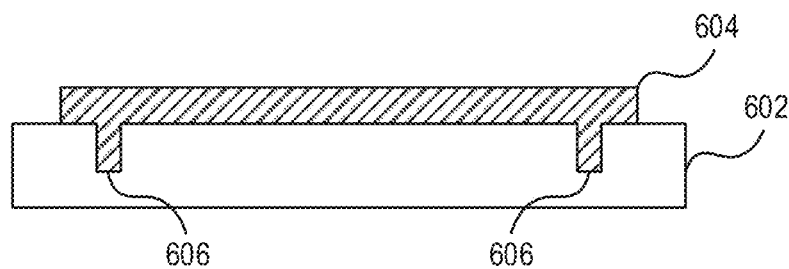
FIG. 6A includes a sectional view depicting the pre-forming of a carrier assembly that includes a secondary injection-molded component connected to a primary injection-molded component.

FIG. 6A includes a sectional view depicting the preforming of a carrier assembly 600 that includes a secondary injection-molded component 604 connected to a primary injection-molded component 602. When the secondary injection-molded component 604 overlays the primary injection-molded component 602 as shown in FIG. 6A, the carrier assembly 600 may be described as "tiered." This "tiering" will be especially notable if, as mentioned above, the secondary injection-molded component overlays one or more mounting components that extend upward from the deck area of the primary injection-molded component 602.

In some embodiments, the secondary injection-molded component 604 is not perfectly integrated with the primary injection-molded component 602. For example, if the secondary injection-molded component 604 is formed by depositing a liquified thermoplastic elastomer on the primary injection-molded component 602, then surface features may result in imperfections such as small air gaps between the primary and secondary injection-molded components 602, 604. As another example, a protruding feature disposed along the outer surface of a semiconductor component may pierce the secondary injection-molded component 604 when interconnected with an indentation in the primary injection-molded component 602.

Figure 6B:
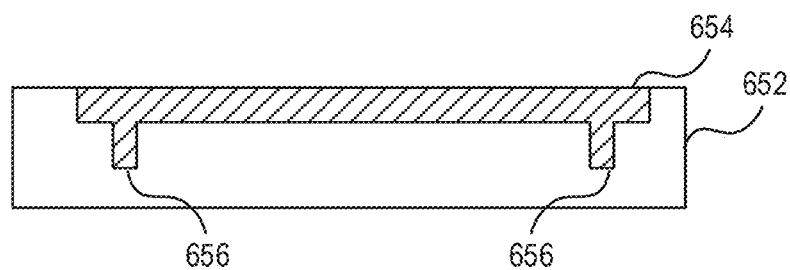
FIG. 6B includes a sectional view depicting a carrier assembly with a secondary injection-molded component integrally molded onto a primary injection-molded component.

FIG. 6B includes a sectional view depicting a carrier assembly 600 with a secondary injection-molded component 654 integrally molded onto a primary injection-molded component 652. In contrast to the carrier assembly 600 of FIG. 6A, the molded carrier assembly 600 shown here may be formed by integrally molding the secondary injection-molded component 654 onto the primary injection-molded component 652 during a lamination process.

Regardless of how the carrier assembly is formed, the secondary injection-molded component 604, 654 may take the form of the deck area of the primary injection-molded component 602, 652. For example, if the primary injection-molded component 602, 652 includes a series of cavities as shown in FIG. 5, then the secondary injection-molded component 604, 654 may conform to each of those cavities.

As shown in FIGS. 6A-B, the primary injection-molded component 602, 652 may include one or more cavities 606, 656 into which a material (e.g., liquified thermoplastic elastomer) that forms the secondary injection-molded component 604, 654 can flow. As the material hardens, anchoring features along the bottom of the secondary injection-molded component 604, 654 will form within these cavities 606, 656. In essence, these anchoring features are representative of "feet" that serve to anchor the secondary injection-molded component 604, 654 to the primary injection-molded component. The cavities could be, for example, notches, holes, or slots. The shape of the cavities 606, 656 (and thus the resulting anchoring features of the secondary injection-molded component 604, 654) is generally not important as the material is sufficiently tacky to as to sufficiently adhere to the primary injection-molded component 602, 652. However, in some embodiments, it may be desirable to further improve adhesion by designing some or all of the cavities 606, 656 for improved gripping. For example, at least some of the cavities could be in the shape of an "L" or "+" to provide at least one horizontal channel in the primary injection-molded component 602, 652 into which the material can flow.

Figure 7:
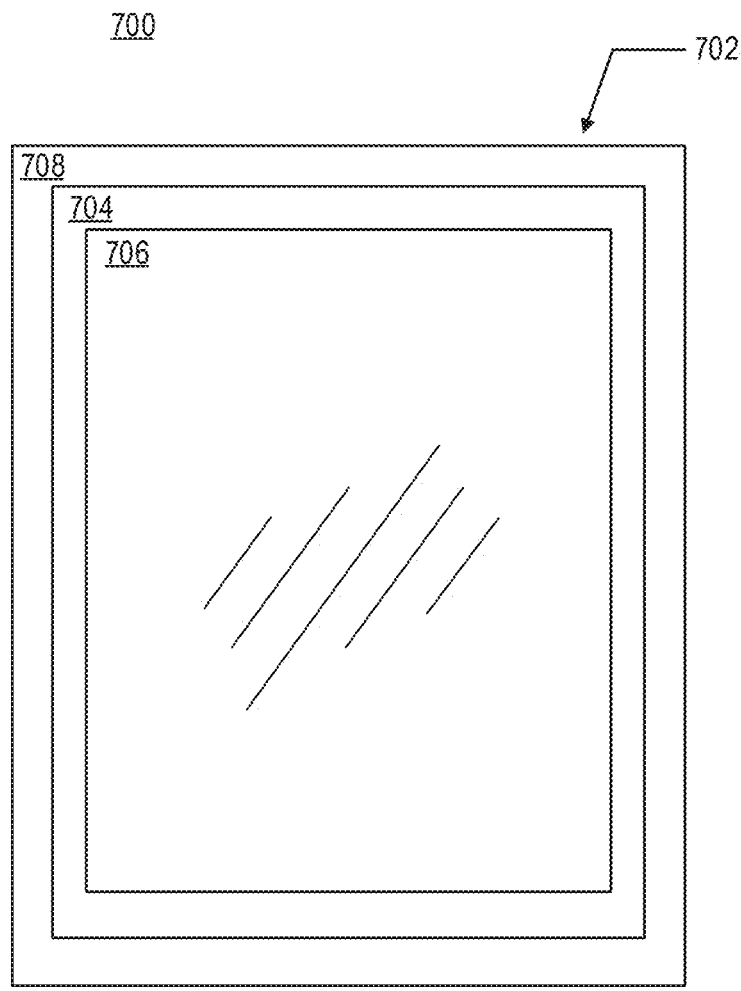
FIG. 7 includes a top plan view of a carrier assembly showing how media can be injected into the deck area of a primary injection-molded component (also referred to as a "substrate") to form a secondary injection-molded component (also referred to as an "overmold").

FIG. 7 includes a top plan view of a carrier assembly 700 showing how media can be injected into the deck area 704 of a primary injection-molded component 702 (also referred to as a "substrate") to form a secondary injection-molded component 706 (also referred to as an "overmold"). The deck area 704 may be set within a rim 708 that extends around a periphery of the carrier assembly 700. In some embodiments the secondary injection-molded component 706 covers the entire deck area 704, while in other embodiments the secondary injection-molded component 706 covers a portion of the deck area 704. Here, for example, a portion of the deck area 704 is left unmolded to create a non-adhesive border.

Figure 8:
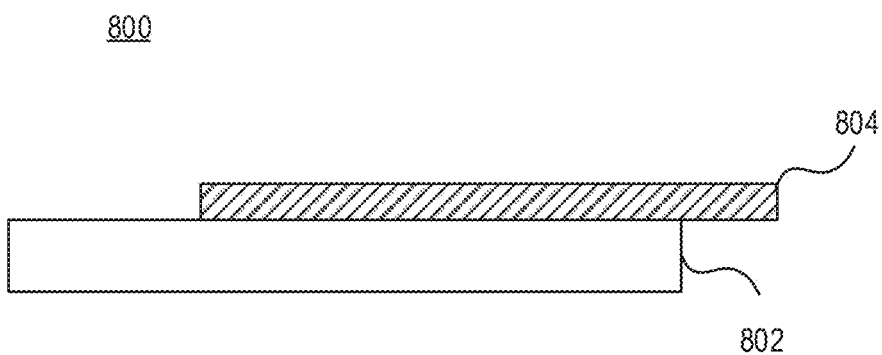
FIG. 8 includes a sectional view of the layers of a carrier assembly that includes a secondary injection-molded component integrally mounted along the deck area of a primary injection-molded component.

FIG. 8 includes a sectional view of the layers of a carrier assembly 800 that includes a secondary injection-molded component 804 integrally mounted along the deck area of a primary injection-molded component 802. More specifically, FIG. 8 depicts an example of a technique for coupling the secondary injection-molded component 804 to the primary injection-molded component 802. Here, the secondary injection-molded component 804 is continuously slid onto the deck area of the primary injection-molded component 802 over time. For example, the secondary injection-molded component 804 may be created by injecting a liquified media (e.g., a thermoplastic elastomer) into a mold, and then the secondary injection-molded component 804 may be slid into securement mechanism(s) arranged along the periphery of the deck area. Alternatively, the secondary injection-molded component 804 may be slid into a cavity formed along the surface of the deck area.

Figure 9:
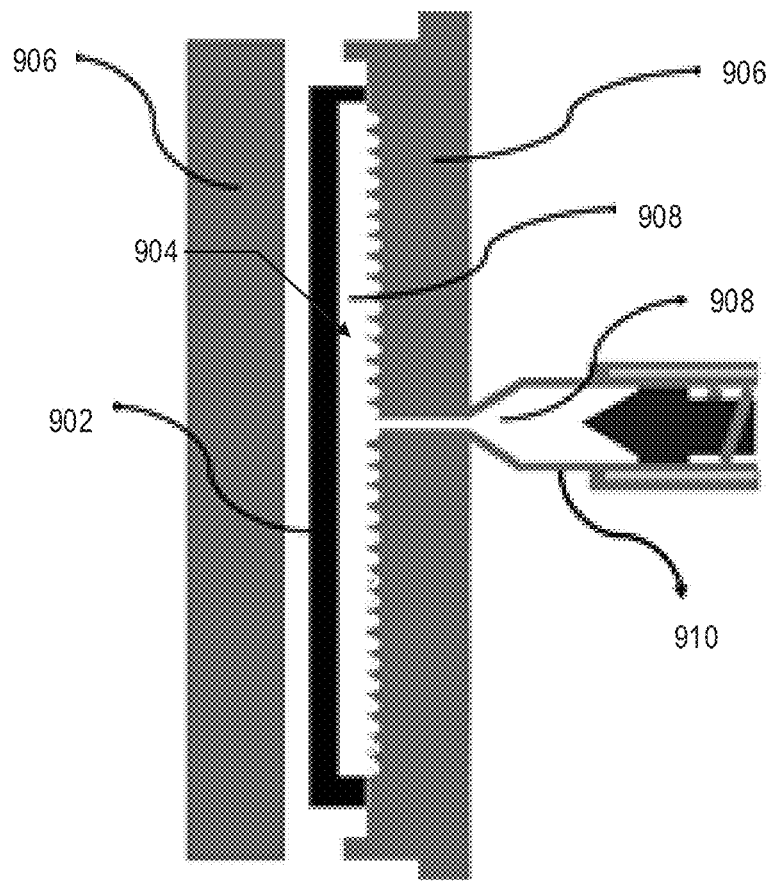
FIG. 9 includes a sectional view illustrating how liquified media (e.g., a thermoplastic elastomer) can be integrally mounted to a primary injection-molded component as part of a molding process.

FIG. 9 includes a sectional view illustrating how liquified media (e.g., a thermoplastic elastomer) can be integrally mounted to a primary injection-molded component as part of a molding process. In particular, FIG. 9 depicts a primary injection molded component 902 with a pre-formed deck area 904 that is enclosed in a mold 906. During the molding process, liquified media 908 is injected onto the pre-formed deck area 904 to form the secondary injection-molded component. As shown in FIG. 9, the liquified media 908 may be injected through an opening in the mold 906 through a nozzle 910. Generally, the nozzle 910 is connected to a cylinder (not shown) in which the material(s) used to form the secondary injection-molded component are liquified.

FIG. 10 is a flowchart of a process 1000 for creating a carrier assembly comprised of a primary injection-molded component and a secondary injection-molded component via overmolding. Overmolding is a two-shot injection molding process that creates a single part (e.g., a carrier assembly) by combining two (or more) complementary materials. As discussed below, the first shot may create the primary injection-molded component using a first material while the second shot may create the secondary injection-molded component using a second material.

Initially, a manufacturer can create a primary injection-molded component by injecting a first liquified material into a mold (step 1001). The first liquified material could be, for example, polycarbonate, PPE, PPO, PPS, a thermoplastic such as polyethylene or polypropylene, liquid crystal polymer, or ECTFE. Generally, the first liquified material is selected by the manufacturer such that the primary injection-molded component (also referred to as the "substrate") is fairly rigid.

Then, the manufacturer can create a secondary injection-molded component by molding a second liquified material over/around the primary injection-molded component (step 1002). For example, if the primary injection-molded component takes the form of a tray with a substantially planar deck area as shown in FIGS. 1 and 5, the manufacturer may eject the second liquified material across the deck area to create a secondary injection-molded component that is chemically/mechanically integrated with the deck area. Generally, the secondary injection-molded component (also referred to as the "overmold") is comprised of a softer material than the primary injection-molded component. For example, the secondary injection-molded component may be comprised of a thermoplastic elastomer. Examples of thermoplastic elastomers include TPS, TPO, TPV, TPU, TPC, and TPA. In such embodiments, the manufacturer may simply obtain the second liquified material by applying heat to thermoplastic elastomer pellets.

Thereafter, the manufacturer can remove the carrier assembly formed from the primary and secondary injection-molded components from the mold (step 1003). Alternatively, the manufacturer may remove the primary injection-molded component from the mold prior to creating the secondary injection-molded component. Thus, the secondary injection-molded component may be overmolded onto a freestanding primary injection-molded component.

Those skilled in the art will recognize that the process 1000 could include other embodiments. For example, the manufacturer may opt to cure the first liquified material after it has been injected into the mold to quicken the pace with which the primary injection-molded component is made, improve crosslinking, etc. Additionally or alternatively, the manufacturer may opt to cure the second liquified material after it has been molded to the primary injection-molded component to quicken the pace with which the secondary injection-molded component is made, improve crosslinking, etc.

FIG. 11 is a flowchart of another process 1100 for creating a carrier assembly comprised of a primary injection-molded component and a secondary injection-molded component. Initially, a manufacturer can acquire a primary injection-molded component (step 1101). Generally, the primary injection-molded component takes the form of a rigid tray with a deck area. While the deck area will often be substantially planar, the deck area may include structural features, such as cavities, designed to facilitate the securement of semiconductor components. In some embodiments, the manufacturer creates the primary injection-molded component via an injection molding process rather than acquire it from another manufacturer. Thus, the manufacturer may create the primary injection-molded component by injecting a first liquified material into a first mold. The primary injection-molded component may be comprised of a rigid material, such as molded plastic or molded resin. Examples of such materials include polycarbonates, PPE, PPO, PPS, thermoplastics such as polyethylene or polypropylene, liquid crystal polymer, and ECTFE.

The manufacturer can then secure a secondary injection-molded component to at least a portion of the primary injection-molded component (step 1102). For example, the secondary injection-molded component may be secured to the deck area of the rigid tray as a single continuous (i.e., unbroken) sheet. This can be done in several different ways. For example, the secondary injection-molded component may be overmolded onto the primary injection-molded component as discussed above with respect to FIG. 10. As another example, the secondary injection-molded component may be secured to the deck area of the rigid tray via a lamination process, spray process, or co-extrusion process. Alternatively, the secondary injection-molded component may be secured against the deck area of the rigid tray with securement mechanism(s), retained within a cavity defined in the deck area of the rigid tray, etc. Generally, the secondary injection-molded component has sufficient bonding strength to be mounted onto the deck area without adhesive. For example, the manufacturer may create the secondary injection-molded component by injecting a second liquified material into a second mold. The second liquified material may be tacky in its non-liquified state, which enables the manufacturer to simply secure the secondary injection-molded component against the primary injection-molded component without adhesive.

In some embodiments, the manufacturer causes static electricity to be discharged from the carrier assembly formed from the primary and secondary injection-molded components (step 1103). For example, the manufacturer may discharge static electricity from the carrier assembly by initiating contact between the primary injection-molded component and a grounded object. As another example, the manufacturer may discharge static electricity from the carrier assembly by installing object(s), such as a ground plane, within the carrier assembly that will facilitate the discharge. Discharging static electricity reduces the likelihood of harming any semiconductor components stored in the carrier assembly due to static shock or electricity otherwise passing through when it should not be.

Thereafter, the manufacturer can allow a semiconductor component to be secured to the secondary injection-molded component (step 1104). Semiconductor components may utilize the surface energy and/or tackiness of the secondary injection-molded component for seating attachment at a certain density (e.g., a maximum continuous density) along the deck area of the primary injection-molded component. In some embodiments, the semiconductor component is simply secured to the top surface of the secondary injection-molded component. In other embodiments, the semiconductor component includes a protruding feature designed to mate with a recess formed in the primary injection-molded component and/or secondary injection-molded component. For example, if the secondary injection-molded component extends across a recess formed in the primary injection-molded component, the protruding feature may puncture the secondary injection-molded component as it enters the recess.

FIG. 12 is a flowchart of a process 1200 for transporting semiconductor components using the carrier assemblies described herein. Initially, an individual can obtain a semiconductor component (step 1201) that requires transport, storage, etc. Examples of semiconductor components include wafers (e.g., singulated wafers and diced wafers), dies (e.g., bumped dies or bare dies), and other microelectronic components used in the fabrication of ICs.

Then, the individual can adhere the semiconductor component to the tacky injection-molded component of the carrier assembly (step 1202). For example, the individual may manually secure the semiconductor component to the tacky injection-molded component or prompt an automatic-placement machine to secure the semiconductor component to the tacky injection-molded component. Generally, the tacky injection-molded component is representative of an insert/addition to a primary injection-molded component. For example, the tacky injection-molded component may be located within a deck area of the primary injection-molded component. Semiconductor components may be secured to the tacky injection-molded component (or a series of tacky injection-molded components) in a matrix pattern designed to maximize the density of semiconductor components along the deck area of the primary injection-molded component. For example, the individual may secure the semiconductor component in a predetermined location (e.g., defined by a notch in which a protruding component of the semiconductor component is installed).

The carrier assembly can then be transported to a desired location (step 1203). During transport, the carrier assembly can be moved along x-axis, y-axis, or z-axis without substantially moving or damaging the semiconductor component(s) stored therein. Upon receipt of the carrier assembly by an intended recipient (e.g., an IC manufacturer), each semiconductor component can be removed by simply overcoming the surface energy of the tacky injection-molded component (step 1204). Removal may be done manually (e.g., by a human hand) or automatically (e.g., by an automatic-placement machine).

Unless contrary to physical possibility, it is envisioned that the steps described above may be performed in various sequences and combinations. For example, a manufacturer may acquire a primary injection-molded component on which a secondary injection-molded component has already been overmolded. In such instances, the manufacturer may simply secure semiconductor component(s) to the secondary injection-molded component and then provide the carrier assembly to another entity (e.g., a manufacturer of ICs).

Additional steps could also be included in some embodiments. For example, after semiconductor component(s) have been secured to the secondary injection-molded component, a cover tape may be secured over the deck area to hold the semiconductor component(s) in place. The cover tape may only be used in certain situations (e.g., long-distance transport or long-term storage) where the carrier assembly is expected to undergo bumping, shaking, etc. As another example, the manufacturer may emboss features on the secondary injection-molded component that are intended to better secure semiconductor components. For instance, the manufacturer may stamp cavities for retaining semiconductor components into the secondary injection-molded component.

REMARKS

The foregoing examples of various embodiments have been provided for the purposes of illustration and description. These examples are not intended to be exhaustive. Many variations will be apparent to one skilled in the art. Certain embodiments were chosen in order to best describe the principles of the technology introduced herein, thereby enabling others skilled in the relevant art to understand the claimed subject matter, the various embodiments, and the variations that may be suited to particular uses.

The language used in the specification has been principally selected for readability and instructional purposes. It may not have been selected to delineate or circumscribe the subject matter. Therefore, it is intended that the scope of the technology be limited not by this specification, but rather by any claims that issue based hereon. Accordingly, the disclosure of the technology is intended to be illustrative (rather than limiting) of the scope of the technology, which is set forth in the following claims.

What is claimed is:

1. A method for manufacturing a carrier assembly for semiconductor components, the method comprising:
    ejecting a first liquified media into a mold to create a tray having a substantially planar deck with (i) a cavity defined therein and (ii) a structural feature arranged along a periphery of the substantially planar deck, wherein to remove the tray from the mold, pressure is applied to the structural feature rather than the substantially planar deck;
    removing the mold;
    ejecting a second liquified media onto the substantially planar deck of the tray, such that the second liquified media flows into the cavity and forms, along at least a portion of the substantially planar deck, a tacky surface; and enabling semiconductor components to be detachably secured to the tacky surface along the substantially planar deck of the tray.

2. The method of claim 1, wherein the first liquified media is polycarbonate, polyphenylene ether, polyphenylene oxide, polyphenylene sulfide, polyethylene, polypropylene, liquid crystal polymer, or ethylene chlorotrifluoroethylene.

3. The method of claim 1, wherein the second liquified media is a thermoplastic elastomer.

4. The method of claim 3, wherein the second liquified media is a styrenic block copolymer, thermoplastic polyolefin elastomer, thermoplastic vulcanizate, thermoplastic polyurethane, thermoplastic copolyester, or thermoplastic polyamide.

5. The method of claim 1, wherein the tacky surface is one of multiple tacky surfaces formed across the substantially planar deck of the tray.

6. The method of claim 1, wherein the second liquified media is continuously ejected across the substantially planar deck of the tray to create a single tacky sheet that covers roughly an entirety of the substantially planar deck.

7. A method comprising:
obtaining a tray that has a substantially planar deck on which a semiconductor component is to be secured and one or more features around a periphery of the substantially planar deck, wherein the substantially planar deck has one or more cavities defined therein; and
ejecting liquified thermoplastic elastomer onto the substantially planar deck of the tray, wherein the one or more features around the periphery inhibit overflow of the liquified thermoplastic elastomer from the substantially planar deck while the liquified thermoplastic elastomer flows into the one or more cavities and forms, along the substantially planar deck of the tray, a flexible injection-molded component having one or more anchoring features, each of which corresponds to a different one of the one or more cavities, and a tacky upper surface;
wherein tackiness of the flexible injection-molded component is sufficient to allow the semiconductor component to be detachably secured to the tacky upper surface through stiction.

8. The method of claim 7, further comprising:
embossing a feature on the flexible injection-molded component that facilitates the detachable securement of the semiconductor component.

9. The method of claim 8, wherein the feature is an indentation in which the semiconductor component is placed.

10. The method of claim 7, wherein the flexible injection-molded component includes a sunken feature with which a protruding feature of the semiconductor component is engageable.

11. The method of claim 7, wherein the flexible injection-molded component comprises at least one layer of thermoplastic elastomer overmolded on the substantially planar deck of the tray.

12. The method of claim 7, wherein the tray comprises a molded plastic or a molded resin.

13. The method of claim 7, wherein the tray comprises a first material that provides rigidity and a second material that facilitates dissipation of collected electricity.

14. The method of claim 13, wherein said obtaining comprises:
forming the tray by injecting a liquified material into a mold.

15. The method of claim 7, further comprising:
causing static electricity to be discharged by initiating contact between the tray, with the flexible injection-molded component formed thereon, and a grounded object.

* * * * *